United States Patent [19]

Asano

[11] Patent Number: 5,406,529

[45] Date of Patent: Apr. 11, 1995

[54] FLASH NON-VOLATILE MEMORY

[75] Inventor: Hideo Asano, Machida, Japan

[73] Assignee: International Business Machines Corporation, Armonk, N.Y.

[21] Appl. No.: 125,058

[22] Filed: Sep. 21, 1993

[30] Foreign Application Priority Data

Sep. 22, 1992 [JP] Japan .................................. 4-252386

[51] Int. Cl.$^6$ ............................................. G11C 16/02
[52] U.S. Cl. .............................. 365/230.03; 365/218; 365/900; 395/425; 395/400
[58] Field of Search ............... 365/900, 218, 200, 201; 395/425, 400

[56] References Cited

U.S. PATENT DOCUMENTS

| 4,638,430 | 1/1987 | Perra et al. ........................... 364/300 |
| 5,138,580 | 8/1992 | Farrugia et al. ..................... 365/218 |
| 5,297,103 | 3/1994 | Higuchi ............................ 365/189.01 |

FOREIGN PATENT DOCUMENTS 0392895 10/1990 European Pat. Off. ...... G11C 16/06

OTHER PUBLICATIONS

IEEE Spectrum, Dec. 1989, pp. 30–33, entitled "Flash memories: the best of two worlds," by Richard D. Pashley and Stefan K. Lai of Intel Corporation.

Primary Examiner—Viet Q. Nguyen
Attorney, Agent, or Firm—Roy W. Truelson; Matthew J. Bussan

[57] ABSTRACT

A flash-erase memory includes a plurality of blocks accessible by a processor and, in association with each block, a block ID representing an address (RBA) specified by the processor upon writing, a revision code (RC) indicating how many times the processor performed writing using the same RBA, and an erase count (EC) indicating the number of times of erasing of this block are stored. Writing is performed to a writable block having the minimum erase count, and if there is a different block having the same block ID as the address specified by the processor, its revision code is updated and used as a revision code of the written block, and the different block is erased and its erase count is updated.

16 Claims, 5 Drawing Sheets

| PHYSICAL ADDRESS | RBA | | | RC | EC | OW |
|---|---|---|---|---|---|---|
| | HEAD NO. | CYLINDER NO. | SECTOR NO. | | | |
| ENTRY 0 | | | | | | |
| ENTRY 1 | | | | | | |
| ENTRY 2 | | | | | | |
| ............ | | | | | | |

FIG. 4

FLASH NON-VOLATILE MEMORY

FIELD OF THE INVENTION

The present invention relates to a flash non-volatile memory called flash EEPROM or flash memory, and more particularly to a flash non-volatile memory (hereinafter referred to as flash memory) capable of dynamically allocating memory blocks.

BACKGROUND OF THE INVENTION

As portable personal computers such as notebook type ones have spread, the requirement for small-sized, lightweight and low power consumption computer systems has increased. An external storage system or solid state file using solid state memory has a low power consumption and can operate at a high speed because, unlike a magnetic disk apparatus, it does not have a mechanical drive system. Further, since it is composed of small memory modules, it is small-sized, lightweight, and has a large degree of freedom with respect to shape as compared with the magnetic disk apparatus, and is also easily made in the form of a card.

However, a conventional solid state memory has many problems with respect to such points as cost, capacity and battery backup. If SRAM is used as the memory, the cost is high and hence the capacity becomes small though the backup time by a battery becomes long. For DRAM which is excellent in cost and capacity, the standby power consumption is large and the backup time is limited to one week or so. There is also a danger of data loss due to a problem in the battery system. EEPROM is costly though it requires no battery.

A flash memory has been developed as a memory to solve these problems. Its memory element is composed of one transistor as DRAM so that it can be packaged in high density, and it is expected to have a bit cost equivalent to or less than DRAM (low cost, large capacity), depending on the future market. The memory element is non-volatile and does not require the battery backup. Erasure is generally performed for each chip or for each smaller block. An outline of such flash memory is introduced by Richard D. Pashley et al in "Flash memories: the best of two worlds", IEEE SPECTRUM, December 1989, pp. 30-33. As far as performance is concerned, the block erase type is superior to the chip erase type.

When flash memory of the block erase type is used for a solid state file, it is convenient to memory management if the size of a block is made equal to a sector, which is a unit of access in the magnetic disk apparatus. European Patent Application 392895, for example, discloses a flash EEPROM system of sector erase type. The system makes it possible to simultaneously erase any plural sectors by providing a latch for each sector, which is a unit of erasing, and setting a latch corresponding to a sector to be erased. Also known is a flash memory whose unit of erasing is a block having a size equivalent to a plurality of sectors (e.g., 4K bytes). This is sometimes called a cluster erase type to distinguish from the sector erase type.

However, flash memory has limitations which SRAM and DRAM do not have. First, the programming of memory bits is a one-way process and change is allowed only from 0 to 1 or from 1 to 0. Therefore, when new data is to be written to a memory location which has already been written, writing should be performed after a block including that memory location is erased to all 0 or all 1 state. It usually takes several tens of milliseconds to several seconds for erasing and writing. Further, the flash memory deteriorates with erasing and writing and reaches a use limit, which at present is after several tens of thousands to several hundreds of thousands of erasing and writing cycles.

SUMMARY OF THE INVENTION

If such flash memory is used for a solid state file, a problem arises when a portion of memory is frequently written. For example, in a DOS-based personal computer system, a file allocation table (FAT) is frequently updated. However, since the FAT address is fixed, a block storing the FAT has to be erased and then written each time the FAT is updated, in case of the flash memory, and it takes several tens of milliseconds to several seconds each time. Further, if a particular block which is a portion of memory is frequently erased and written, that block reaches the use limit faster than other blocks and, therefore, the memory needs to be replaced even if the other blocks can still be used. Early replacement of the memory could be avoided if the block which reached the use limit is invalidated and an alternative block is used instead. However, this means that a block on which writing is concentrated is merely changed to the alternative block and, therefore, does not provide a radical solution.

Still further, requested erasing or writing might not be completed if power is turned off while the flash memory is erased and written since it takes several tens of milliseconds to several seconds as described above. In that case, the contents of a block which was being erased or written are unpredictable. Therefore, the flash memory also requires a measure against the abnormal power-off.

Accordingly, it is an object of the present invention to provide a flash memory in which writing is not concentrated on a portion of memory.

It is another object of the present invention to provide a flash memory which is not affected by a power-off during erasing or writing.

A flash memory according to the present invention includes a plurality of blocks accessible by a processor. When the processor issues a write command, the present invention dynamically allocates a block to be written based on the number of times each block has been erased regardless of the address specified by the processor. The number of times each block has been erased is indicated by an erase count in control information of each block. In addition to the erase count, the control information further includes a block ID representing an address specified by the processor upon writing to the block, and a revision code indicating how many times the processor performed writing for the same block ID. Writing is performed to a writable block having the minimum erase count and the control information is then updated. A block whose revision code has been reset is writable. Further, if there is an old block having the same block ID as that specified for the current writing, the revision code of the old block is updated and used as the control information of a new written block. The old block is erased and its erase count is updated.

In the embodiments described later, each block comprises a header section and a data section, and control information is stored in the header section. When a block is erased, the erase count is incremented by one and written back to the header section of the erased block. The revision code thereof remains erased or reset which indicates that the block is writable. The contents of the header section of each block are read out by a controller, prior to operation. The controller creates a memory management table in its own memory (random access memory) using the contents. The table contains entries corresponding to the respective blocks of the flash memory. Each entry contains a physical address of a corresponding block, the information read out from the header section, that is, a block ID, a revision code, and an erase count, and a flag indicating whether the block is writable or non-writable, If there are two blocks having the same block ID and different revision codes (this situation would occur if an old block could not be erased due to the abnormal power-off) in creating the memory management table, the controller erases a block having a smaller revision code which is an older block and updates its erase count. The controller executes a command from the processor using the memory management table and updates an associated entry, if necessary.

BRIEF DESCRIPTION OF THE DRAWINGS

FIG. 4 shows the configuration of a memory management table.

DETAILED DESCRIPTION OF THE PREFERRED EMBODIMENT

Figure 1:
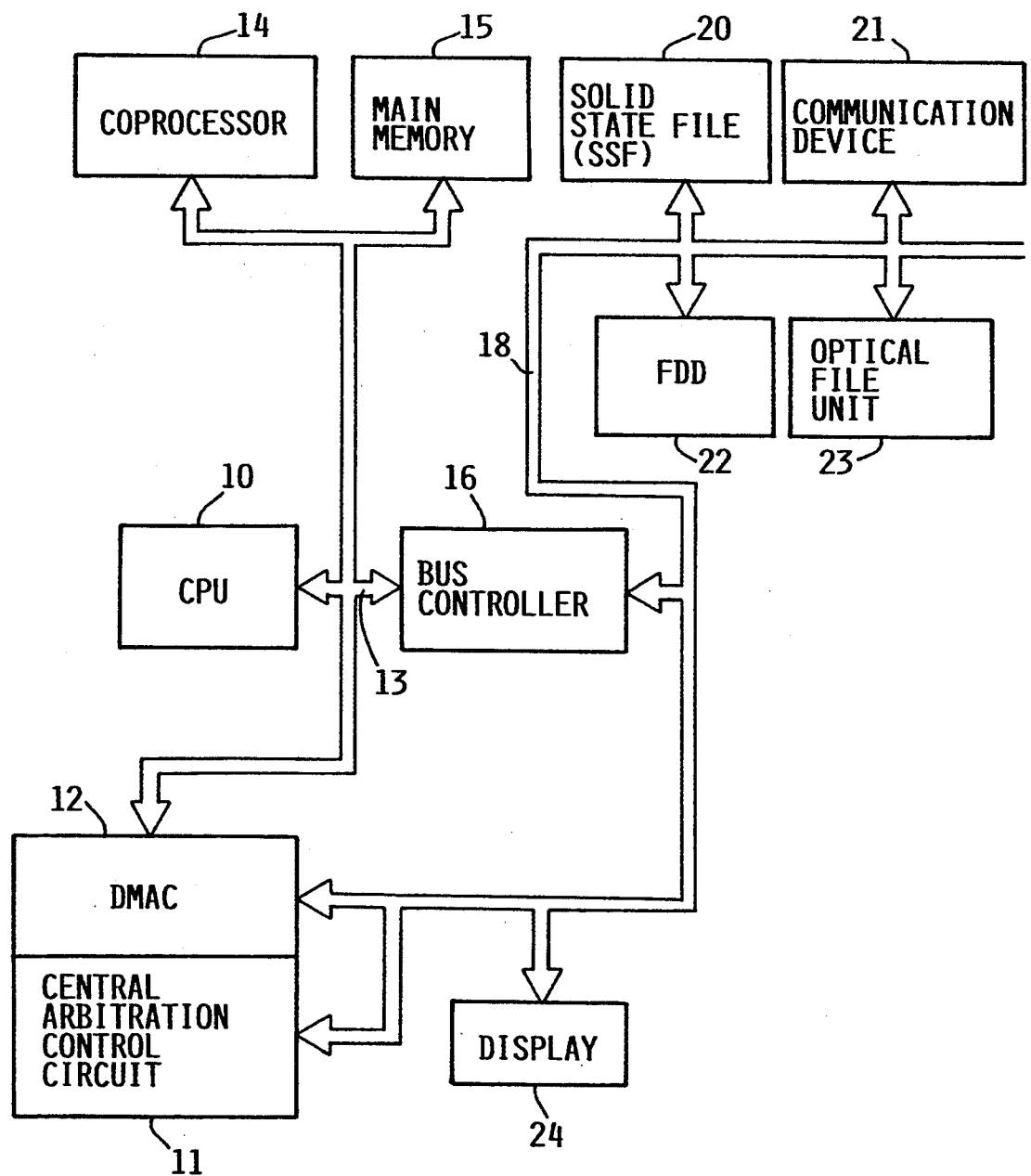
FIG. 1 is a block diagram showing an example of a computer system in which a flash memory according to the present invention is used as a solid state file.

FIG. 1 shows an example of a computer system in which a flash memory according to the present invention is incorporated as a solid state file. CPU 10 communicates, through system bus 13, with main memory 15, bus controller 16, and optional math co-processor 14. Communications between CPU 10 and peripheral equipment are performed through bus controller 16. To this end, bus controller 16 is connected, through family bus 18, to the peripheral equipment. Solid state file (SSF) 20 made of a flash memory according to the present invention, communication device 21, floppy disk drive (FDD) 22, optical file unit 23, and display device 24 are connected to family bus 18 as the peripheral equipment. Of course, other peripheral equipment may also be connected. An example of such a computer system is the IBM PS/2.

Direct memory access controller (DMAC) 12 is provided to enable memory access by all or some selected peripheral equipment. To this end, at least a portion of family bus 18 is branched to DMAC 12. Each peripheral device which is allowed DMA is provided with an arbitration circuit, though not shown in the drawing figure, and is assigned an arbitration level (priority). In association with DMAC 12, central arbitration control circuit 11 is provided which arbitrates among a plurality of peripheral devices simultaneously requesting the DMA and informs DMAC 12 which peripheral device is granted the DMA. Details of the DMA control by DMAC 12 and central arbitration control circuit 11 are described in U.S. Pat. No. 4,901,234.

CPU 10 uses SSF 20 as a hard disk drive. Therefore, when SSF 20 is accessed, a relative block address (RBA) comprising a head number, a cylinder number and a sector number, is sent to SSF 20. In the present invention, however, the relationship between the RBA provided by CPU 10 and an address (physical address) of a block of SSF 20, which is actually accessed, is not fixed and varies each time writing is performed, as described below. Therefore, a means (memory management table) is provided for indicating the relationship. The RBA from CPU 10 may be deemed to be a logical address.

Figure 2:
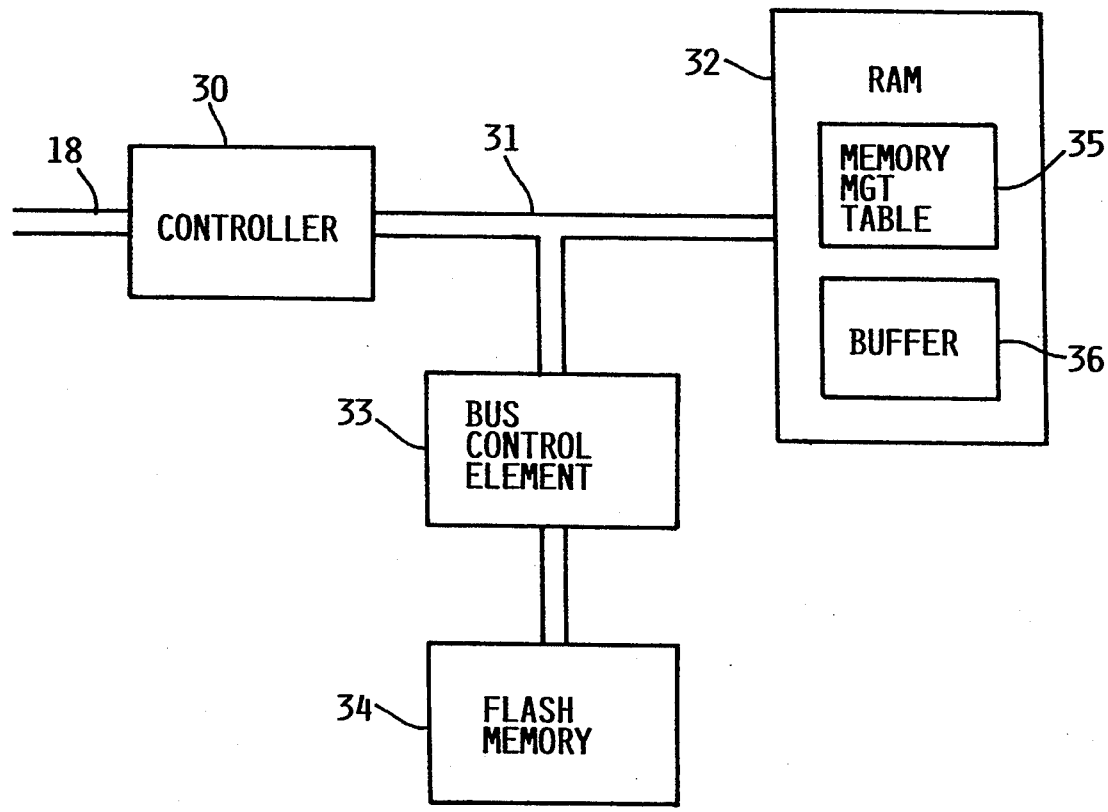
FIG. 2 is a block diagram showing the schematic configuration of the solid state file.

FIG. 2 shows a schematic configuration of SSF 20. SSF 20 comprises controller 30 connected to family bus 18, and internal bus 31 through which random access memory (RAM) 32, bus control element 33 and flash memory 34 are connected to controller 30. RAM 32 includes an area 35 for storing a memory management table described below and buffer area 36. Bus control element 33 has the well-known receiver/driver configuration for interconnecting internal bus 31 and memory bus 37 connected to flash memory 34. In the embodiment, bus control element 33 performs a two byte parallel transfer between buses 31 and 37, but the present invention is not limited to such parallel transfer. Further, as far as the present invention is concerned, flash memory 34 may be any erase type, but in the following, it is assumed for convenience that flash memory 34 is a sector erase type. Therefore, one block equals one sector.

Figure 3:
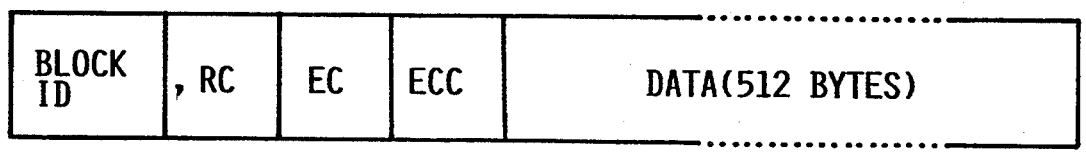
FIG. 3 shows the structure of each block (sector) of the flash memory.

FIG. 3 shows the structure of each block (sector) of flash memory 34. As seen, each block comprises a header section in addition to a data section for storing sector data of 512 bytes. The header section includes a block ID represented by a relative block address (RBA) specified by CPU 10 upon writing to the block, a revision code (RC) indicating how many times the blocks of the same RBA have been revised or rewritten, an erase count (EC) indicating the number of times of erasing of this physical block, and an error correction code (ECC) for checking and correcting errors in the entire block. Both the block ID and RC are initialized to 0 at the time of shipment from a plant while an initialized value of the EC is a number n which represents the number of times the block was erased in a test before shipment. The number of bits of the RC and EC should be selected so as to be able to represent a larger number than the nominal maximum number of times of erasing/writing of the flash memory. In this embodiment, each of the RC and EC comprises four bytes. Each of the block ID, RC and EC contains for each byte a parity bit for detecting an error. This is needed when the memory management table described below is created.

Controller 30 shown in FIG. 2 reads the header information of each block at power-on time and creates in area 35 of RAM 32 a memory management table as shown in FIG. 4. Each entry of the memory management table corresponds to a particular block in flash memory 34. Therefore, when flash memory 34 contains n blocks, the memory management table contains up to n entries. Controller 30 does not create an entry for an invalid block having a defect. Each entry contains a physical address of a corresponding block; a relative block address (head number/cylinder number/sector number), a revision code (RC) and an erase count (EC)

contained in the header section of the block; and an OK write or writable flag (OW). The writable flag indicates whether the corresponding block is empty and writable (OW=0) or it is non-writable since valid data exists (OW=1). If the revision code contained in the header section is 0 when the memory management table is created, the writable flag in the corresponding entry is set to 0; otherwise, it is set to 1.

The operation of SSF 20 in response to a command from CPU 10 is next described with reference to the flowchart of FIG. 5. Controller 30 of SSF 20 receives a command at step 100 and decodes it at the next step 101. The operation goes to step 102 in case of a read command and to step 104 in case of a write command. The operation for the write command is first described.

When the write command is detected at step 101, controller 30 writes data from CPU 10 into buffer 36 and proceeds to step 104. At step 104, it is determined by accessing memory management table 35 whether there is a block having the OW equal to 1 and the RBA which is the same as the RBA of the write command. If there is, the operation goes to step 105 to retrieve and save a physical address, RC and EC in an entry having the same RBA. The physical address is saved so as to erase a block specified by the physical address later. It is not preferable to erase the block at step 105 since the RC may not be recovered if an abnormal power-off occurs. This will be described later.

If either step 105 is completed or a block having the same RBA is not found at step 104, the operation goes to the next step 106. At step 106, a block having the OW equal to 0 and the minimum EC is searched by accessing memory management table 35. If such a block, that is, a block which is writable and whose number of times of erasing is minimum is found, the operation goes to step 107 where the block is written and memory management table 35 is updated.

The block writing is performed by using the physical address in the corresponding entry of memory management table 35. Written to the block are data from CPU 10 (stored in buffer 36) and the above-mentioned header information except the EC. As described below, the EC has already been written by an updated value. Controller 30 increments the RC saved at step 105 by one to provide new header information. If step 105 was not executed, the RC is set to 1 since the RBA specified by CPU 10 is written for the first time. Further, the RBA of the write command detected at step 101 is used, as it is, for the block ID to be written as the header information. Controller 30 generates parity bits of the RC and block ID updated in this way, adds them to the RC and block ID, respectively, and then writes them together with the data read from buffer 36, to the specified block. An ECC is generated using the updated RC and block ID, the EC in the corresponding entry of memory management table 35, and the data read from buffer 36. The ECC is written in the header information to the same block. The corresponding entry of memory management table 35 is also updated by using the new RBA and RC, and its OW is set to 1.

If a plurality of blocks are found at step 106, writing is performed to one of them (for example, a block having the minimum physical address). Since a flash memory generally includes a spare block, a writable block having the OW set to 0 can be successfully found.

When the writing to the block at step 107 is completed, the block specified by the physical address saved at step 105 is erased; the EC saved at step 105 is written into the header section of the erased block after incrementing by one and adding a parity bit; and the corresponding entry of memory management table 35 is updated so that EC=EC+1 and OW=0 (step 108).

When step 108 is completed, controller 30 waits for the next command from CPU 10. At that time, controller 30 may, in advance, select the next block to be written by executing Step 106. In doing so, a write cycle can be shortened since step 106 becomes unnecessary when CPU 10 issues a new write command.

In case of a read command, the operation goes from step 101 to step 102 where controller 30 obtains a physical address of a block to be read by accessing memory management table 35 shown in FIG. 4 using an RBA (head number/cylinder number/sector number) from CPU 10. At the next step 103, the specified block is read by providing the physical address to flash memory 32 and an error is checked using the ECC in its header section. If an uncorrectable error is not detected at step 109, 512 byte data contained in the read block is transferred to CPU 10 through buffer area 36 of RAM 32. Such transfer through the buffer area is identical with that performed in the hard disk drive.

If an uncorrectable error is detected, the operation goes to step 110. The uncorrectable error detected in the read block indicates that there is a possibility that the contents of data may have been corrupted due to a power-off during the previous writing to the block. At step 110, CPU 10 is informed of the occurrence of an uncorrectable error and the block is erased.

Additionally, if an uncorrectable error is detected, it is necessary to estimate the number of times of past erasing of the block erased at step 110 since there is a possibility that an error has occurred in the EC in the corresponding entry of the memory management table created by the sequence of FIG. 6 described below, which error cannot be detected by a conventional parity check. In this embodiment, an EC of an adjacent block (for example, a block at a physical address which is either lower or higher by one) is used as the estimated value. The EC can be obtained from the memory management table. If reliability is more important, an EC read from an actual adjacent block in flash memory 34 may be used. Since, in general, there is little difference between the numbers of times of erasing of the adjacent blocks, no problem arises even if the EC of an adjacent block is used as the EC of the block erased at step 110. It is also possible to use an average value of the EC's of some adjacent blocks though calculation is required. At the next step 111, the EC obtained in this way is incremented by one and then written into the erased block. Finally, the corresponding entry in the memory management table is updated at step 112. That is, the new EC is written and the OW is set to 0.

Though other commands such as clear, status read and so on may be decoded at step 101, they will not be described here because the present invention does not relate thereto.

Next, the creation of memory management table after power-on will be described in more detail with reference to FIG. 6 so as to clarify a measure against an abnormal power-off. As described above, controller 30 creates the memory management table as shown in FIG. 4 by sequentially reading the headers of n blocks making flash memory 34 at power-on time. To this end, when power is turned on at step 200, a block address BA is initialized to 0 at the next step 201 and a header at BA=0 is read at step 202. It is not necessary to read the data section. At the next step 203, it is determined by the parity check whether an error occurred in the header. The operation goes to step 204 if no error occurred, otherwise to step 205.

At step 204, an entry of the memory management table is created using the header information read at step 202. First, a physical address is BA used to read the header. A block ID, RC and EC are provided by using the contents of the header with no change. With respect to the block ID, however, some higher bits of its head number, cylinder number and sector number may be dropped when the entry is created because the number of bits of each number has been determined with certain allowance and the higher bits thereof are usually 0. This leads to a smaller number of bits of each entry. Finally, a writable flag OW is set to 0 if the RC read is 0, otherwise set to 1. The RC of 0 indicates that a block containing it has been erased and hence is writable. Though not shown in FIG. 4, it is desirable to add an ECC in each entry for error detection and correction.

When the entry creation is completed, the block address BA is incremented by one at step 206, and it is determined at step 207 whether the reading of headers of all n blocks has been completed. If not, the operation goes back to the header reading step 202 and repeats steps 202 to 207.

If an error is detected in the header read at step 202, the operation branches from step 203 to step 205. At step 205, it is determined by reading the entire block and applying the ECC whether the error is correctable. If correctable, the error is corrected at step 209 and then the above mentioned step 204 is executed to create an entry using the corrected header. If the error is uncorrectable, steps 210 and 211 are executed in the same manner as in steps 110 and 111 which were executed when the uncorrectable error was detected in the sequence of FIG. 5, and then the operation goes to step 204. Since the entry created at this time is that of the erased block, the OW is set to 0 as described above.

When the operation for the last or n-th block is completed, the loop comprising step 202 to step 207 exits to step 208. At step 208, blocks having the same block ID and different RC's are searched by accessing the memory management table created. If such blocks are found at step 212, it indicates that, due to power-off, the old block is not erased completely, as should have been done at step 108 in FIG. 5. Therefore, the operation goes to step 213 where a block having a smaller RC is erased, its EC is incremented by one and written into the erased block, and, in the corresponding entry of the memory management table, EC is updated and OW is set to 0.

Figure 5:
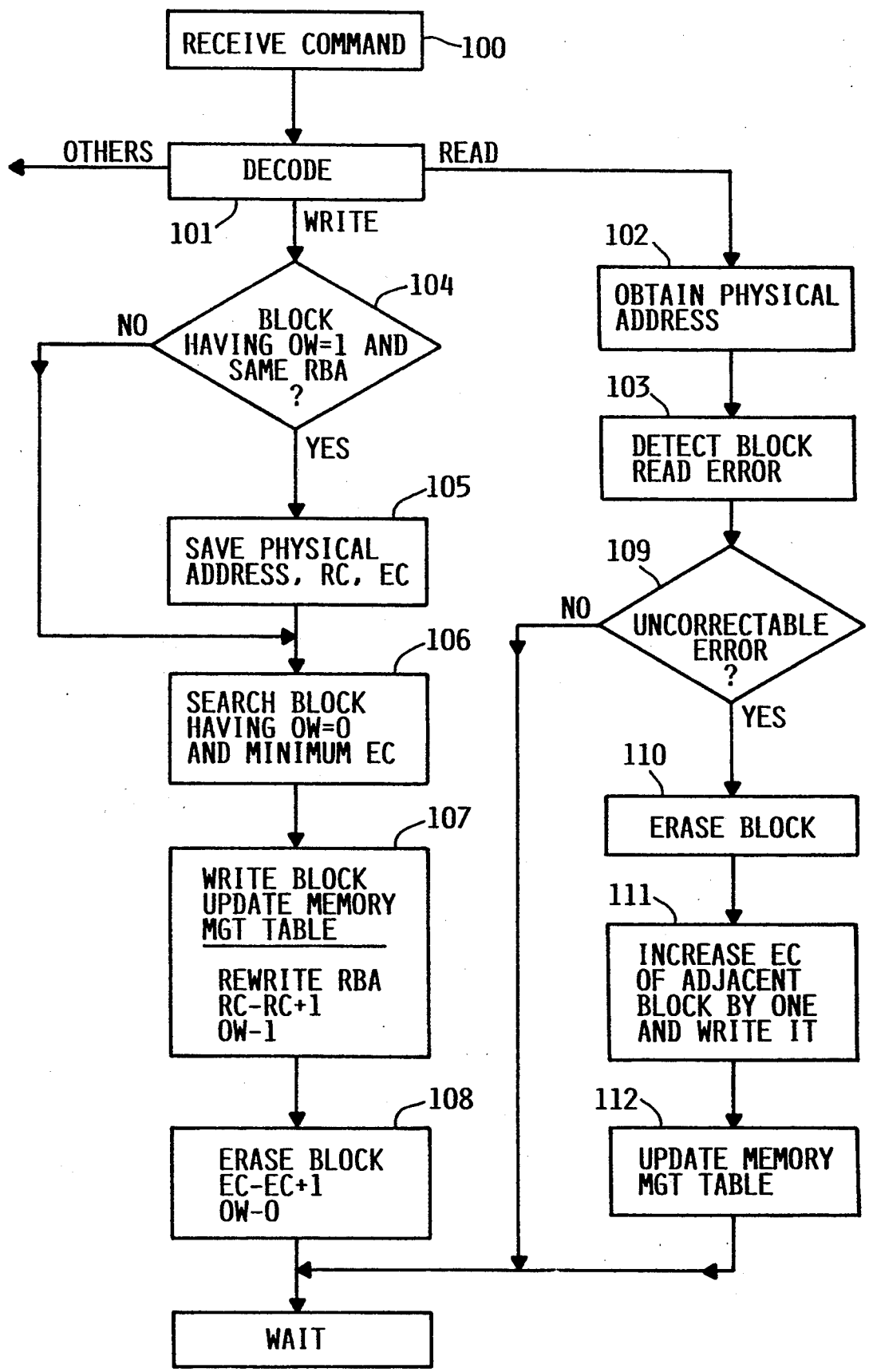
FIG. 5 is a flowchart showing the operation of the controller 30 after receiving a command from the CPU 10.
Figure 6:
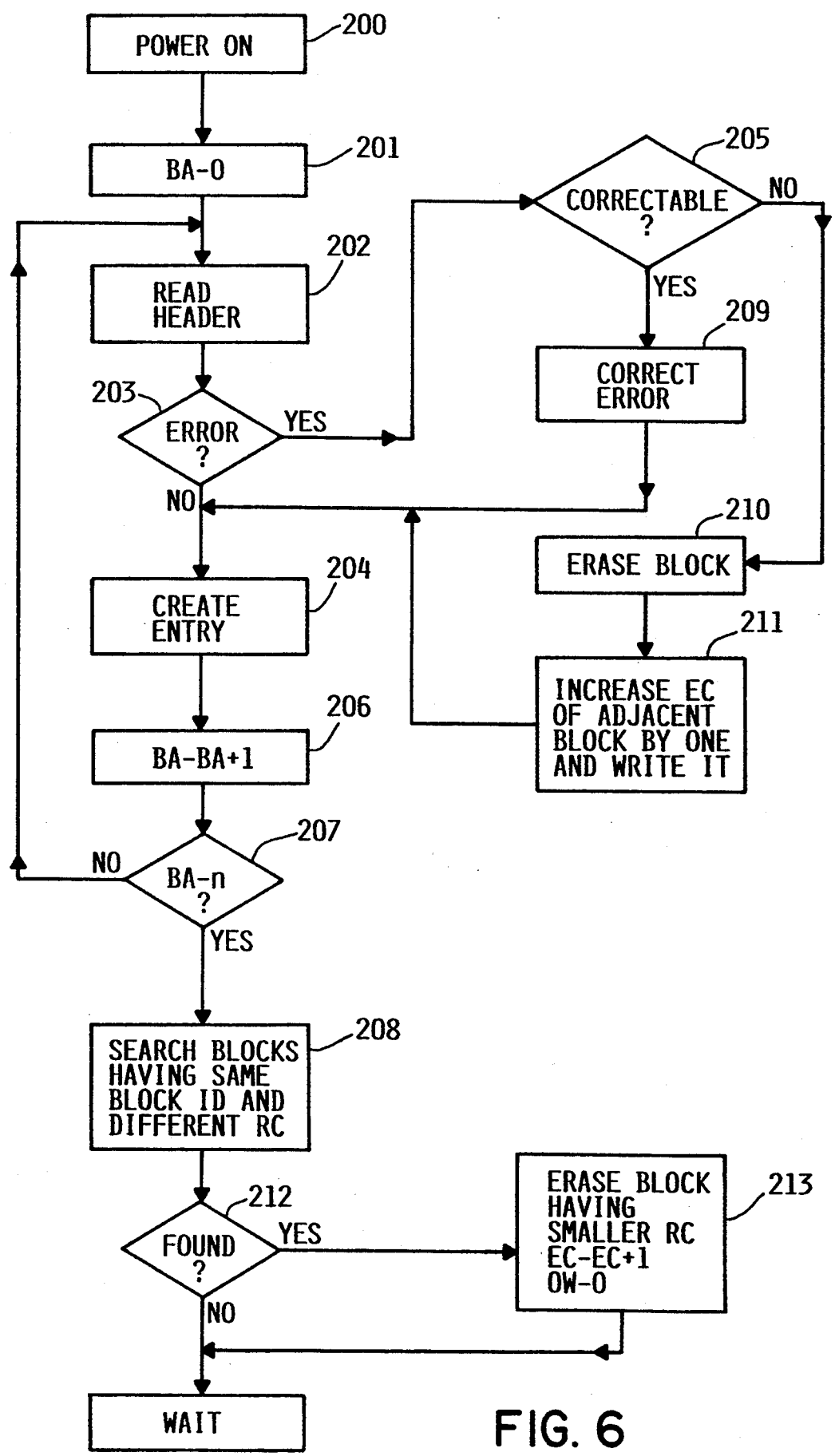
FIG. 6 is a flowchart showing the operation of the controller 30 to create the memory management table at power-on time.

When either no block is found at step 212 or step 213 is completed, controller 30 exits from the sequence of FIG. 6 and waits for a command from CPU 10. As described above, step 106 in FIG. 5 may be executed during waiting.

Though not described in the above sequences of FIG. 5 and FIG. 6, it is well known in the art that verification is performed after block writing and erasing and the block may be determined to be unusable as a result thereof. Of course, it is unnecessary to create an entry of the memory management table for such a block. Further, if a block corresponding to an entry already created is determined to be unusable, the entry should be invalidated. The invalidation of the entry may be accomplished, for example, by setting the RBA to an invalid value or by providing a bit for indicating valid or invalid and setting it to an invalid state.

If the number of blocks (sectors) constituting the flash memory and hence the number of entries the memory management table increases, add it takes longer time to search the memory management table at the time of reading or writing, the search time can be reduced by dividing the memory management table for each head or cylinder which is one element of the RBA. In that case, the numbers of times of erasing/writing of blocks are evened for each divisional unit, e.g., for each cylinder and, therefore, they may not be evened among different cylinders. If this is the case, a block of a cylinder in which the number of times of erasing/writing has increased may be exchanged with a spare block or a block of a different cylinder in which the number of times of erasing/writing is small, to even them in the entire flash memory.

Though a flash memory of a sector erase type is assumed in the above description, it should be noted that the present invention is also applicable to a flash memory of a cluster erase type in which a cluster comprising a plurality of sectors is bulk erased. In that case, the operations of controller 30 are essentially the same as those shown in FIG. 5 and FIG. 6 with the exception that the block erase is not performed at steps 108 and 110 in FIG. 5 and steps 210 and 213 in FIG. 6. However, an additional step is required to determine when and which cluster should be erased. This step may count the number of blocks which have been determined to be erased in each cluster and erase a cluster in which the count reaches a predetermined threshold. If this step is used, it is necessary, before erasing a cluster, to move the contents of valid blocks, if any, in that cluster to writable block positions in a different cluster. The movement of a valid block is practically the same as the execution of a write command. Therefore, controller 30 reads the contents of the valid block into RAM 32 and then writes back to flash memory 34 by executing steps similar to steps 106 and 107 in FIG. 5. The movement of a valid block and the cluster erase are performed when no command is received from CPU 10. This is also true for the chip erase type.

Thus, according to the present invention, it is possible to prevent erasing and writing of a flash memory from being concentrated on a particular block. Further, even if an abnormal power-off occurs during erasing or writing, its influence could be reduced to the minimum.

What is claimed is:

1. A flash non-volatile memory, comprising:
   a plurality of non-volatile memory blocks accessible by a processor;
   means for maintaining control information in each block, said control information including a respective block ID representing a relative block address specified by said processor upon writing, and an erase count indicating the number of times each respective block has been erased;
   means, responsive to a request to write data to said flash non-volatile memory at a specified relative block address, for identifying a writable block having a minimum erase count;
   means for writing said data to said identified block having a minimum erase count; and
   means for updating said block ID contained in said control information to correspond to said specified relative block address.

2. The flash non-volatile memory according to claim 1, wherein:
    said control information further includes a revision code for each block, said revision code having a value indicating how many times said processor performed writing to the block D of the respective block; and
    said memory further comprises:
        means for replacing a revision code value associated with said identified block having a minimum erase count with a revision code value obtained by updating a revision code value of a second block having the same block ID as said block ID represented by said specified address;
        means for erasing said second block; and
        means, responsive to said means for erasing, for updating the erase count in said control information associated with said second block.

3. The flash non-volatile memory according to claim 2, wherein the revision code of said identified block is set to a first value if said second block does not exist.

4. The flash non-volatile memory according to claim 2, wherein said revision code and said erase count are updated by incrementing by one.

5. The flash non-volatile memory according to claim 1, wherein each of said plurality of blocks comprises a header section and a data section, and said control information is stored in said header section.

6. The flash non-volatile memory according to claim 5, wherein when a block is erased, an erase count included in its header section is updated and written back to said header section of said block.

7. A solid state file apparatus which is accessed by a relative block address from a processor, comprising:
    a controller for connecting to said processor; and
    a flash non-volatile memory connected to said controller and including a plurality of blocks accessible by said processor, each block of said flash non-volatile memory comprising a header section and a data section, said header section including a block ID representing a relative block address specified by said processor upon writing to the respective block, and an erase count indicating the number of times the respective block has been erased;
    wherein said controller further comprises:
        (a) means, responsive to a request by said processor to write data to a specified relative block address, for identifying a writable block in said flash non-volatile memory having a minimum erase count;
        (b) means for writing data for said processor to the data section of said identified block having a minimum erase count; and
        (c) means for writing to the header section of said identified block having a minimum erase count a block ID represented by said specified relative block address.

8. The solid state file apparatus according to claim 7, further comprising:
    a random access memory connected to said controller; and
    means in said controller for creating a memory management table in said random access memory having entries corresponding to the respective blocks by sequentially reading from each block of said flash non-volatile memory the contents of the header section and writing into said random access memory.

9. The solid state file apparatus according to claim 8, wherein each entry of said memory management table contains, in addition to the contents of the header section of a corresponding block, a physical address of said corresponding block and a flag indicating whether said corresponding block is writable or non-writable.

10. The solid state file apparatus according to claim 7, wherein:
    said header section of each block further includes a revision code, said revision code having a value indicating how many times said processor performed writing to the block ID specified in said header section; and
    said controller further comprises:
        (d) means for writing to the header section of said identified block having a minimum erase count a revision code value made by updating a revision code value of a second block having the same block ID as said block ID represented by said specified relative block address;
        (e) means for erasing said second block; and
        (f) means, responsive to said means for erasing, for updating an erase count in the header section of said second block.

11. The solid state file apparatus according to claim 10, wherein the revision code of said identified block is set to a first value if said second block does not exist.

12. The solid state file apparatus according to claim 10, further comprising:
    a random access memory connected to said controller; and
    means in said controller for creating a memory management table in said random access memory having entries corresponding to the respective blocks by sequentially reading from each block of said flash non-volatile memory the contents of the header section and writing into said random access memory.

13. The solid state file apparatus according to claim 12, wherein each entry of said memory management table contains, in addition to the contents of the header section of a corresponding block, a physical address of said corresponding block and a flag indicating whether said corresponding block is writable or non-writable.

14. The solid state file apparatus according to claim 13, wherein if there are two blocks having the same block ID and different revision codes when said memory management table is created, said controller erases the block having the smaller revision code, updates its erase count, and sets a flag in a corresponding entry in said memory management table to a writable state.

15. The solid state file apparatus according to claim 14, wherein said controller accesses said memory management table in response to a command from said processor and, in case of a read command, reads said flash non-volatile memory by using a physical address in an entry containing a block ID representing the relative block address of said read command, or, in case of a write command, writes said flash non-volatile memory by using a physical address in an entry in which said flag is set to the writable state and the erase count is minimum.

16. The solid state file apparatus according to claim 15, wherein upon creating said memory management table, if the revision code in the header section of one of the respective blocks read has been reset due to erasure, said controller sets the flag in a corresponding entry to the writable state, otherwise it sets to the non-writable state.

* * * * *